United States Patent
Kobashi et al.

[11] Patent Number: 6,031,782
[45] Date of Patent: Feb. 29, 2000

[54] SEMICONDUCTOR MEMORY DEVICE PROVIDED WITH AN INTERFACE CIRCUIT CONSUMING A REDUCED AMOUNT OF CURRENT CONSUMPTION

[75] Inventors: Hisao Kobashi; Mikio Sakurai; Susumu Tanida, all of Hyogo, Japan

[73] Assignee: Mitsubishi Denki Kabushiki Kaisha, Tokyo, Japan

[21] Appl. No.: 09/124,514

[22] Filed: Jul. 29, 1998

[30] Foreign Application Priority Data

Jan. 16, 1998 [JP] Japan .................................. 10-006499

[51] Int. Cl.$^7$ ...................................................... G11C 7/00
[52] U.S. Cl. ........................... 365/228; 365/226; 365/227; 365/222
[58] Field of Search .................... 365/222, 221, 365/230.01, 226, 228

[56] References Cited

U.S. PATENT DOCUMENTS

| | | | |
|---|---|---|---|
| 5,627,791 | 5/1997 | Wright et al. | 365/222 |
| 5,629,897 | 5/1997 | Iwamoto et al. | 365/195 |
| 5,708,611 | 1/1998 | Iwamoto et al. | 365/195 |
| 5,708,622 | 1/1998 | Ohtani et al. | 365/233 |
| 5,798,976 | 8/1998 | Arimoto | 365/222 |
| 5,818,777 | 10/1998 | Seyyedy | 365/222 |
| 5,835,448 | 11/1998 | Ohtani et al. | 365/233 |

FOREIGN PATENT DOCUMENTS 9-186578  7/1997  Japan .

*Primary Examiner*—Viet Q. Nguyen
*Attorney, Agent, or Firm*—McDermott, Will & Emery

[57] ABSTRACT

A clock buffer in a semiconductor memory device includes two kinds of interface circuits, i.e., an LVTTL interface and an SSTL interface. When the semiconductor memory device is set to a specific mode (self-refresh mode) for suppressing a power consumption, the LVTTL is used for taking in an external signal. In a mode other than the self-refresh mode, the SSTL interface is used to take in an externally supplied signal. Thereby, a current can be suppressed in the specific mode.

17 Claims, 10 Drawing Sheets

FIG. 4A SEL 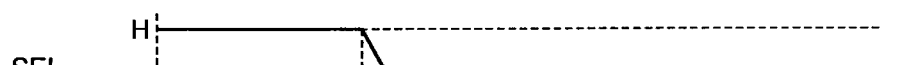
FIG. 4B NODE N1 
FIG. 4C Vref 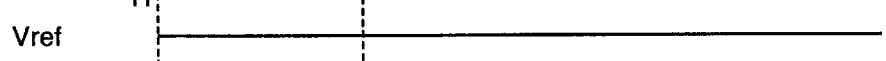
FIG. 4D NODE Y1 
FIG. 4E NODE Z1 
FIG. 4F CKE 
FIG. 4G VOUT1 
FIG. 4H VOUT2 

FIG. 6A SEL
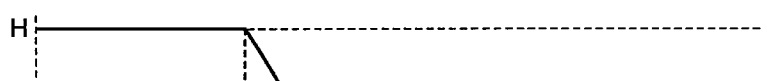
FIG. 6B /SEL
FIG. 6C Vref
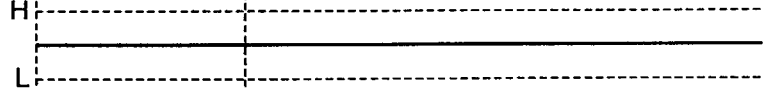
FIG. 6D NODE Y2
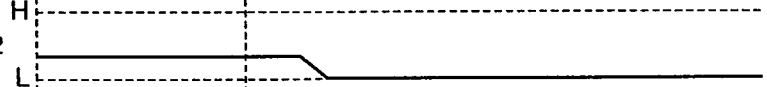
FIG. 6E NODE Z1
FIG. 6F CKE
FIG. 6G VOUT1
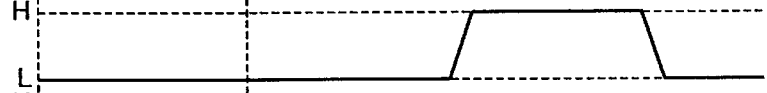
FIG. 6H VOUT2
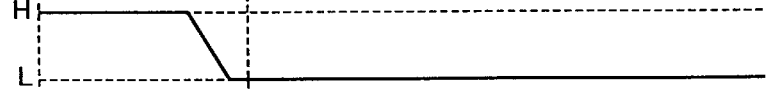

FIG. 10A SEL
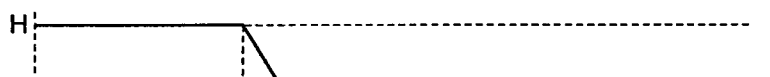
FIG. 10B /SEL
FIG. 10C Vref
FIG. 10D NODE Y2
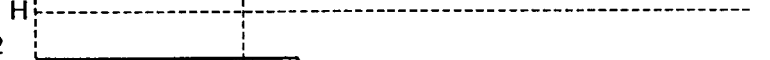
FIG. 10E NODE Z1
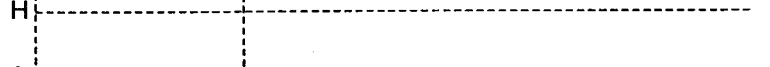
FIG. 10F CKE
FIG. 10G VOUT1
FIG. 10H VOUT2

6,031,782

SEMICONDUCTOR MEMORY DEVICE PROVIDED WITH AN INTERFACE CIRCUIT CONSUMING A REDUCED AMOUNT OF CURRENT CONSUMPTION

BACKGROUND OF THE INVENTION

1. Field of the Invention

The present invention relates to a semiconductor memory device, and particularly a semiconductor memory device which can operate selectively in a plurality of operation modes, and has a structure which can achieve a low current consumption and a fast operation.

2. Description of the Background Art

A semiconductor memory device in the prior art will be briefly described below with reference to FIG. 11.

A semiconductor memory device 9000 in the prior art shown in FIG. 11 includes input buffers 1.1, 1.2, . . . , 1.m, an internal circuit 900 and output buffers 9.1, 9.2, . . . , 9.n.

Input buffers 1.1, 1.2, . . . , 1.m, which will be generally referred to as "input buffers 1" hereinafter, determine logical levels of externally applied signals EXT1, EXT2, . . . , EXTm, and thereby produce internal signals at the corresponding logical levels for sending them to internal circuit 900, respectively. Internal circuit 900 performs predetermined operations in accordance with internal signals sent from input buffers 1, respectively. Output buffers 9.1, 9.2, . . . , 9.n amplify signals produced by internal circuit 900 and externally output them (signals D1, D2, . . . , Dn). Input buffer 1 may be an LVTTL interface which is a typical example of a TTL (Transistor Transistor Logic) interface.

An example of a specific structure of input buffer 1 will be described below with reference to FIG. 12.

Input buffer 1 shown in FIG. 12 is a kind of an NOR circuit, which is a kind of conventional LVTTL interface, and will be simply referred to as an NOR circuit 1.

NOR circuit 1 shown in FIG. 12 includes P-channel MOS transistors PLT1 and PLT2 as well as N-channel MOS transistors NLT1 and NLT2. P-channel MOS transistors PLT1 and PLT2 are connected in series between a power supply potential VDD and one of conductive terminals of each of N-channel MOS transistors NLT1 and NLT2. The other conductive terminal of each of N-channel MOS transistors NLT1 and NLT2 is connected to the ground potential.

A gate electrode of each of P-channel MOS transistor PLT2 and N-channel MOS transistor NLT1 receives an input signal VIN (one of signals EXT1, EXT2, . . . , EXTm in FIG. 11).

P-channel MOS transistor PLT2 and N-channel MOS transistor NLT1 form a CMOS inverter. P-channel MOS transistor PLT1 and N-channel MOS transistor NLT2 are control transistors each receiving on the gate electrode an active signal SEL. NOR circuit 1 is enabled and disabled in response to turn-on and turn-off of P-channel MOS transistor PLT1 and N-channel MOS transistor NLT2.

Signal VOUT is issued from the connection node of P-channel MOS transistor PLT2 with respect to N-channel MOS transistors NLT1 and NLT2 in response to input signal VIN. Signal VOUT is sent to internal circuit 900 shown in FIG. 11.

In the case of the LVTTL interface, the upper and lower limits of the potential of externally supplied input signal VIN are 2.0 V and 0.8 V (LVTTL level), respectively.

At the LVTTL level, all the MOS transistors forming interface circuit 1 are turned on so that a through current flows. In view of this, interface circuit 1 is constructed to be deactivated (disabled) in response to activating signal SEL for preventing wasteful consumption of power at the interface portion when the chip is unselected.

An operation of NOR circuit 1 shown in FIG. 12 will be described below. When activating signal SEL is at the L-level and therefore inactive, P-channel MOS transistor PLT1 is turned on, and N-channel MOS transistor NLT2 is turned off. This enables the input of input signal VIN. For example, when input signal VIN at H-level (2.0 V) is applied, N-channel MOS transistor NLT1 is turned on to output signal VOUT at L-level. When input signal VIN (0.8 V) at L-level is input, P-channel MOS transistor PLT2 is turned on to output VOUT at H-level.

When activating signal SEL is at H-level and therefore inactive, P-channel MOS transistor PLT1 is turned off, and N-channel MOS transistor NLT2 is turned on. Thereby, NOR circuit 2 is disabled, and output signal VOUT is fixed at L-level independently of input signal VIN.

The LVTTL interface meets specifications for power supply voltage VDD of 3.3V, and can cover the operation frequency in a range from about 60 MHz to about 100 MHz.

The operation frequencies of CPUs, MPUs and others have recently increased, and the demand for speeding up the logical interfaces coupled to these memories has further increased.

Under the above situation, the LVTTL interface has reached the limit. In the structure using the TTL interface, no problem arises if the operation frequency is low. If the operation frequency is high, however, overshoot and undershoot become remarkable. Also, serious problems arise in the operation of the whole chip because noises, which are caused by variation in power supply potential and ground potential due to switching, as well as reflection noises and other noises such as cross-talk noises increase. The bus system suffers from such a problem that the power consumption of the device increases due to a large amplitude (i.e., a width of an LVTTL level) of the signal transferred thereby. Therefore, it is necessary to provide a practically available fast interface which can reduce the amplitude of the signal.

As one of the measures, there is an SSTL (Stub Series Terminated Logic) which is a fast interface. A structure of the SSTL interface will be described below with reference to FIG. 13.

As shown in FIG. 13, SSTL interface circuit 2 includes P-channel MOS transistors PST1 and PST2 as well as N-channel MOS transistors NST1, NST2 and NST3. SSTL interface circuit 2 is formed of a differential amplifier circuit. In the following description, SSTL interface circuit 2 is called simply as a differential amplifier 2.

As shown in FIG. 13, P-channel MOS transistor PST1 and N-channel MOS transistor NST1 are connected in series between power supply node VDD and a node Z1. P-channel MOS transistor PST2 and N-channel MOS transistor NST2 are connected in series between power supply node VDD and node Z1.

Both the gate electrodes of P-channel MOS transistors PST1 and PST2 are connected to a connection node (represented as a node X1) between P- and N-channel MOS transistors PST1 and NST1.

The gate electrode of N-channel MOS transistor NST1 receives reference potential Vref which is an intermediate potential equal to, e.g., ((power supply potential VDD)× 0.45) and therefore equal to about 1.5 V if power supply potential VDD is 3.3 V. N-channel MOS transistor NST2 receives input signal VIN on its gate electrode. Input signal VIN is a signal which oscillates with a small amplitude VH of, e.g., ±0.4 V with respect to reference voltage Vref.

N-channel MOS transistor NST3 is connected between node Z1 and the ground potential. N-channel MOS transistor NST3 receives activating signal SEL on its gate electrode. N-channel MOS transistor NST3 is a control transistor, and differential amplifier 2 is enabled/disabled in response to turn-on/off of N-channel MOS transistor NST3.

Signal VOUT is output in response to input signal VIN from the connection node between P-channel MOS transistor PST2 and N-channel MOS transistor NST2. Signal VOUT is transferred to internal circuit 900 shown in FIG. 11.

Then, an operation of differential amplifier 2 shown in FIG. 13 will be described below. When activating signal SEL is at L-level and therefore active, differential amplifier 2 is enabled to amplify and output the potential difference between input signal VIN and reference voltage Vref. For example, when input signal VIN at H-level is supplied, signal VOUT falls to L-level. When input signal VIN at L-level is supplied, signal VOUT rises to H-level.

When activating signal SEL is at H-level and therefore inactive, differential amplifier 2 is disabled, and output signal VOUT is fixed at L-level independently of input signal VIN.

The structure of differential amplifier 2 has an electrically parallel twisted pair line structure so that noise components cancel each other. This allows fast transmission of signals of a small amplitude.

Differential amplifier 2 shown in FIG. 13 is always supplied with reference voltage Vref which is an intermediate potential so that N-channel MOS transistor NST1 is always on.

Therefore, node X1 is pulled toward the ground potential when activating signal SEL is at H-level and therefore is enabled. When the potential on node X1 exceeds the threshold voltage of P-channel MOS transistor due to the foregoing, P-channel MOS transistor PST1 starts to be turned on so that the potential on node X1 will be fixed at the potential which keeps a balance in power or performance between the current supplied from P-channel MOS transistor PST1 and the current supplied from N-channel MOS transistor NST1.

This means that a through current (current) flows from P-channel MOS transistor PST1 through N-channel MOS transistor NST1 when activating signal SEL is at H-level (enabled).

Accordingly, semiconductor memory device 900 employing differential amplifier 2 shown in FIG. 13 suffers from such a problem that a large through current (consumed current) flows as long as it accepts the input signal even if it is desired to minimize the power consumption in the currently selected operation mode.

SUMMARY OF THE INVENTION

Accordingly, an object of the invention is to provide a semiconductor memory device which can achieve fast signal transmission and, in a specific mode for suppressing the current consumption, can reduce the current consumption at an interface.

According to the invention, a semiconductor memory device includes a mode detecting circuit for detecting designation of a specific mode in response to an externally applied mode designating signal, and issuing a corresponding mode trigger signal as a result of the detection; an input terminal for receiving an externally transmitted input signal; an internal circuit for operating in response to the input signal, the externally applied input signal being a signal at a first potential level in the specific mode and, in a mode other than the specific mode, being a signal having a second potential level with a small amplitude logical signal superposed thereon; a first interface circuit being activated in the specific mode to determine a logical level of the input signal based on comparison between the potential level of the input signal supplied through the input terminal and the threshold, and issue an internal signal corresponding to a result of the determination to the internal circuit; and a second interface circuit being activated, in a mode other than the specific mode, to determine the logical level of the input signal based on comparison between the potential level of the input signal supplied through the input terminal and the second potential level, and issue an internal signal corresponding to a result of the determination to the internal circuit.

Accordingly, a major advantage of the invention is that the two kinds of interface circuits are provided for selection so that a fast interface can be achieved by transmitting a signal of a small amplitude in a normal mode, and a current consumption at an interface can be reduced in the specific mode.

Particularly, in a self-refresh mode, the power consumption can be suppressed by selecting the interface circuit.

Particularly, in the self-refresh mode, by operating an LVTTL interface, a current consumption at the interface can be suppressed in the self-refresh mode.

Particularly, in a mode other than the self-refresh mode, fast transmission of signals can be performed by operating a differential amplifier which is an SSTL interface.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4H are timing charts showing an operation of the semiconductor memory device 1000 according to the embodiment 1 of the invention shown in FIGS. 1 to 3;

FIGS. 6A to 6H are timing charts showing an operation of an interface circuit 200.1 shown in FIG. 5;

FIGS. 10A–10H are timing charts for showing an operation of an interface circuit 200.3 shown in FIG. 9;

DESCRIPTION OF THE PREFERRED EMBODIMENTS

[Embodiment 1]

The semiconductor memory device of an embodiment 1 of the invention includes a plurality of interface circuits, and these interface circuits can be selected in accordance with an operation mode so that fast transmission and reduced current consumption can be achieved.

A semiconductor memory device of an embodiment 1 of the invention will be described below with reference to FIG. 1.

Figure 1:
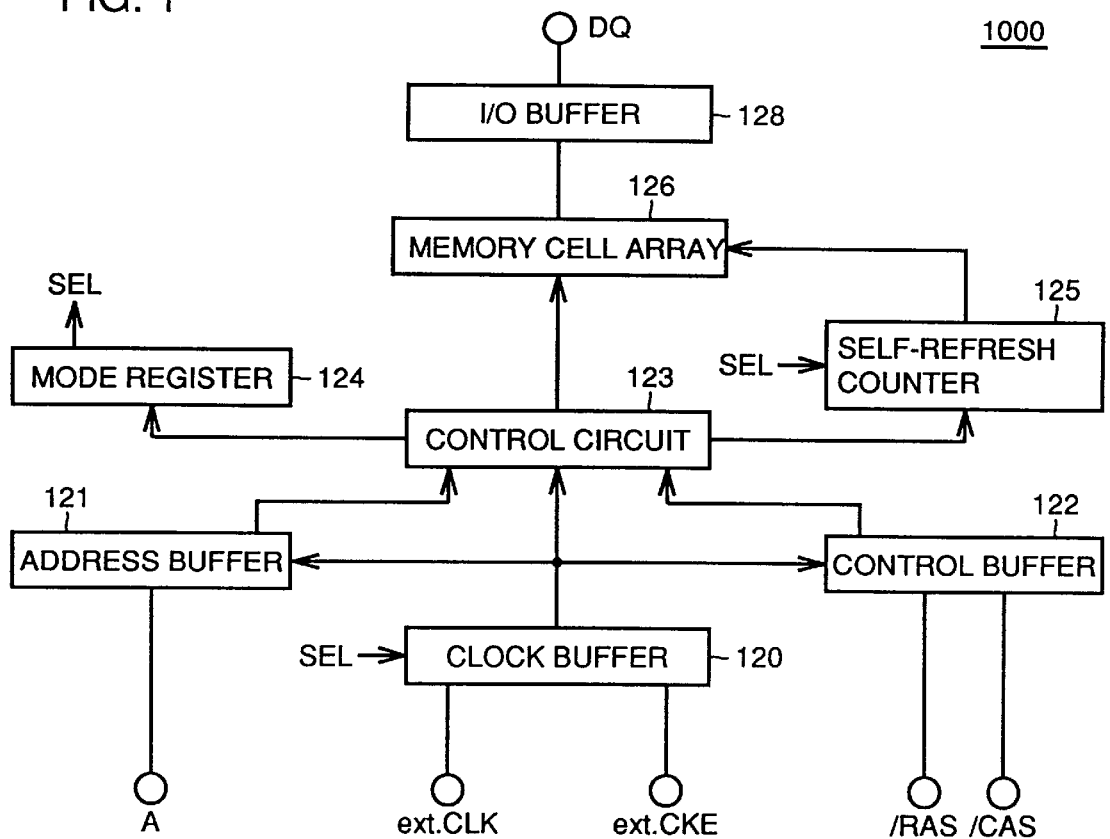
FIG. 1 is a schematic block diagram showing an example of a structure of a major portion of a semiconductor memory device 1000 according to an embodiment 1 of the invention.

A semiconductor memory device 1000 shown in FIG. 1 includes an address buffer 121, a control buffer 122, a control circuit 123 and a mode register 124.

Address buffer 121 takes in an external address signal A through an address pin, and issues a corresponding internal address signal to control circuit 123. Control buffer 122 receives external control signals (e.g., row address strobe signal /RAS, column address strobe signal /CAS, write enable signal /WE and others) through a plurality of control pins, and issues corresponding internal control signals to control circuit 123.

Control circuit 123 produces internal signals for operating internal circuits in response to the internal address signal sent from address buffer 121 and the internal control signals sent from control buffer 122. Mode register 124 receives the internal signals from control circuit 123. By taking in one of the internal signals into mode register 124, the operation mode of semiconductor memory device 1000 is determined.

Semiconductor memory device 1000 further includes a memory cell array 126, an I/O buffer 128, a self-refresh counter 125 and a clock buffer 120.

Memory cell array 126 includes a plurality of memory cells (not shown). Data is written into or read from the memory cell (not shown) in response to the internal signals sent from control circuit 123 and the mode determined by mode register 124. I/O buffer 128 receives data DQ to be written into memory cell array 126 from I/O data pins, or sends data (DQ) read from memory cell array 126 to data I/O pins.

For example, in the read operation mode, mode register 124 is set to the read operation mode based on a combination of the external control signals. Further, the memory cell corresponding to external address signal A is set to the read operation mode. Under the control by control circuit 123, information stored in the selected memory cell is read therefrom. The information read from the memory cell is transmitted to I/O buffer 128, and is externally output (as data DQ) through the data I/O pins. In the write operation mode, one of the memory cells is selected, and data DQ supplied through data I/O pins is written into the selected memory cell.

Clock buffer 120 receives external clock signal ext.CLK, and issues an internal clock signal synchronized therewith.

The internal circuit including control circuit 123, address buffer 121 and control buffer 122 operates in synchronization with the timing of rising of the internal clock signal corresponding to external clock signal ext.CLK.

Clock buffer 120 receives external clock enable signal ext.CKE, and issues the corresponding internal signal. External clock enable signal ext.CKE keeps a constant potential level (i.e., L-level) in the self-refresh mode, and always keeps a state of H-level (reference voltage Vref+ amplitude VH) in the modes other than the self-refresh mode.

Mode register 124 detects the designation of the self-refresh mode from the combination of a plurality of external control signals and the internal signal corresponding to external clock enable signal ext.CKE at L-level, and issues self-refresh trigger signal SEL. Self-refresh counter 125 issues the internal address signal in response to self-refresh trigger signal SEL.

In the self-refresh mode, the memory cells in memory cell array 126 are automatically refreshed based on the internal address signal generated by the self-refresh counter 125. The buffers (address buffer 121, control buffer 122 and I/O buffer 128) other than clock buffer 120 stop their operations in response to the internal signal corresponding to external clock enable signal ext.CKE at L-level. Thus, in the self-refresh mode, reception of inputs from the address pin, control pin and data I/O pin are disabled, and only the clock buffer 120 is enabled.

Clock buffer 120 includes a plurality of interface circuits, as will be described later, and selects the interface circuit which takes in the input signal in accordance with a specific mode. Description will be given, by way of example, on an operation when the specific operation mode is the self-refresh mode, and the input signal based on which the interface circuit is selected is a clock enable signal CKE which is an internal signal corresponding to external clock enable signal ext.CKE.

The interface circuit included in clock buffer 120 of the embodiment 1 of the invention will be described below with reference to FIG. 2.

Figure 2:
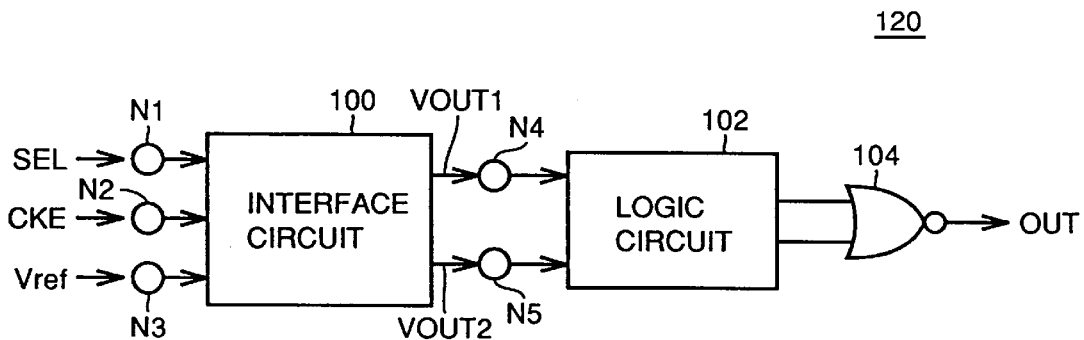
FIG. 2 shows an example of a structure of a major portion of a clock buffer 120 according to the embodiment 1 of the invention.

Clock buffer 120 shown in FIG. 2 includes an interface circuit 100, a logic circuit 102 and an NOR circuit 104.

Interface circuit 100 includes two kinds of interface circuits, as will be described later. Interface circuit 100 receives self-refresh trigger signal SEL sent from a node N1, clock enable signal CKE which is an internal signal sent from a node N2, and reference voltage Vref sent from a node N3. Interface circuit 100 issues a signal VOUT1 or VOUT2 corresponding to clock enable signal CKE from a node N4 or N5 in response to self-refresh trigger signal SEL.

Logic circuit 102 receives signal VOUT1 or VOUT2, and sets the logical level. NOR circuit 104 receives a signal corresponding to signal VOUT1 or a signal corresponding to signal VOUT2 from logic circuit 102, and issues the internal signal corresponding to clock enable signal CKE (OUT in FIG. 2).

Figure 3:
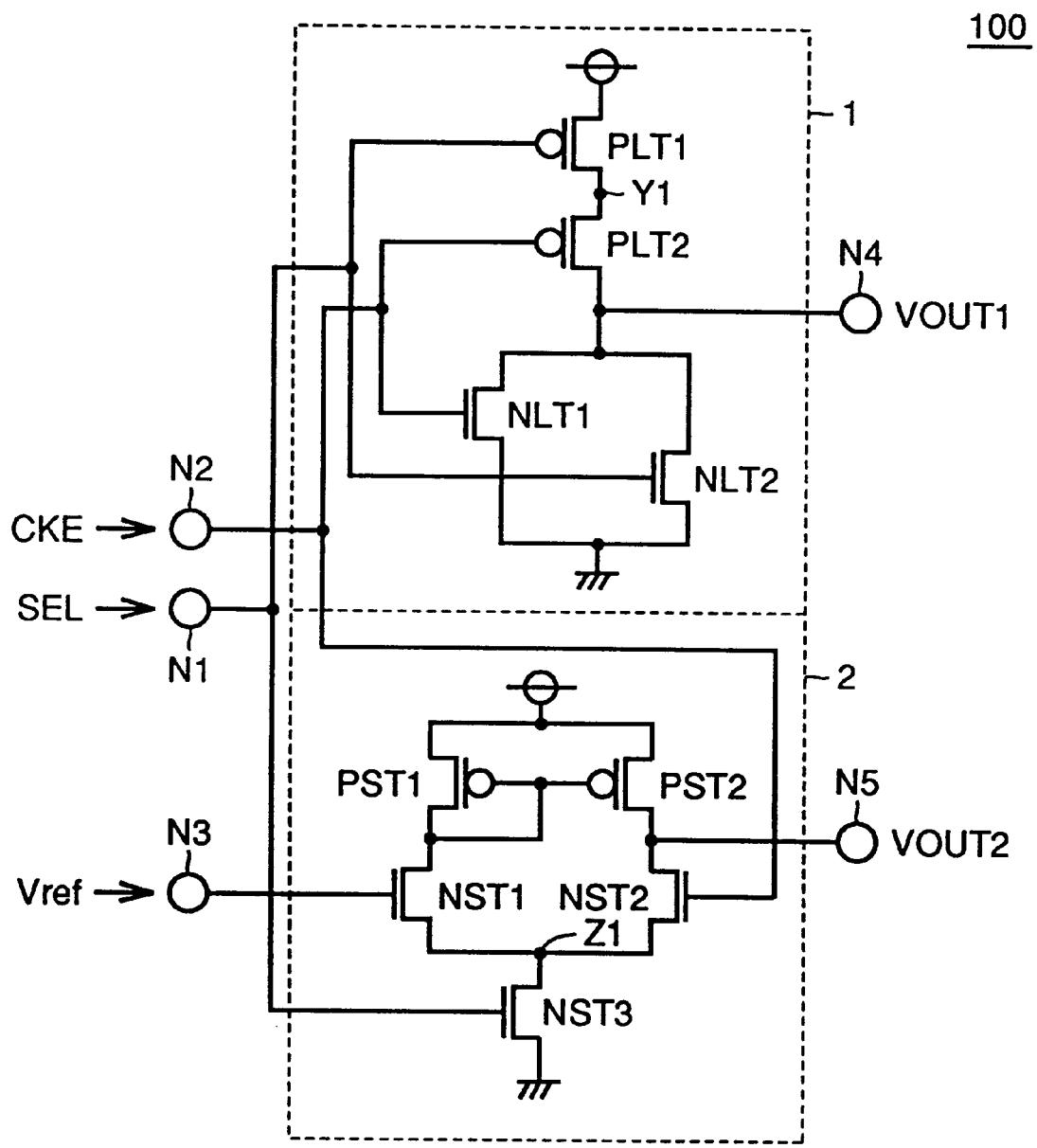
FIG. 3 is a circuit diagram showing an example of a specific structure of an interface circuit 100 according to the embodiment 1 of the invention.

An example of a specific structure of interface circuit 100 will now be described below with reference to FIG. 3.

Interface circuit 100 includes an NOR circuit 1 and a differential amplifier 2.

Figure 12:
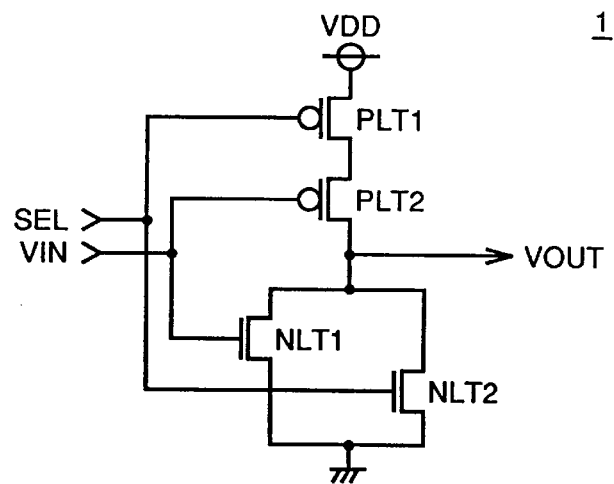
FIG. 12 is a circuit diagram showing an example of a specific structure of an input buffer 1 (LVTTL interface) in the prior art.

As already described with reference to FIG. 12, NOR circuit 1 includes P-channel MOS transistors PLT1 and PLT2 as well as N-channel MOS transistors NLT1 and NLT2.

P-channel MOS transistor PLT1 and N-channel MOS transistor NLT2 receive self-refresh trigger signal SEL on their gate electrodes. P-channel MOS transistor PLT2 and N-channel MOS transistor NLT1 receive clock enable signal CKE on their gate electrodes.

Signal VOUT1 is issued in response to clock enable signal CKE from a node N4 connected to a connection node between P-channel and N-channel MOS transistors PLT2 and NLT1. NOR circuit 1 is the LVTTL interface as already described, and issues signal VOUT1 in response to the input signal at the LVTTL level.

Figure 13:
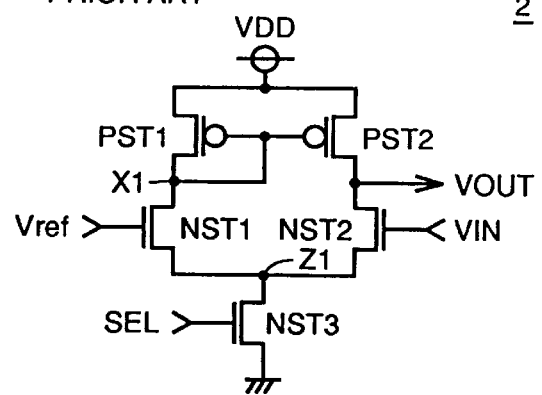
FIG. 13 is a circuit diagram showing an example of a specific structure of an SSTL interface 2 in the prior art.

As already described with reference to FIG. 13, differential amplifier 2 includes P-channel MOS transistors PST1 and PST2 as well as N-channel MOS transistors NST1, NST2 and NST3.

N-channel MOS transistor NST3 receives self-refresh trigger signal SEL on its gate electrode. N-channel MOS transistor NST2 receives clock enable signal CKE on its gate electrode. N-channel MOS transistor NST1 receives reference voltage Vref on its gate electrode. Signal VOUT2 is issued in response to clock enable signal CKE from a node N5 connected to a connection node between P-channel MOS transistor PST2 and N-channel MOS transistor NST2. Differential amplifier 2 is the SSTL interface as already described, and issues signal VOUT2 in response to the signal which oscillates minutely with reference to reference voltage Vref which is an intermediate potential.

An operation of a major portion of semiconductor memory device 1000 shown in FIGS. 1 to 3 will be described below with reference to timing charts of FIGS. 4A to 4H.

An operation of semiconductor memory device 1000 in a mode other than the self-refresh mode will be first described below (time t0–t1). In this case, self-refresh trigger signal SEL is at H-level and therefore inactive. N-channel MOS transistor NST3 is on, and node Z1 (i.e., connection node between N-channel MOS transistors NST1 and NST2) carries a potential at L-level. Therefore, differential amplifier 2 is in the enabled state.

Meanwhile, P-channel MOS transistor PLT1 is off, and N-channel MOS transistor NLT2 is on. A potential on a node Y1, i.e., a connection node between P-channel MOS transistors PLT1 and PLT2 is floated slightly above L-level. Thereby, NOR circuit 1 is disabled.

When clock enable signal CKE at H-level (reference voltage Vref+amplitude VH) is input in the above state, differential amplifier 2 amplifies the potential difference between clock enable signal CKE and reference voltage Vref to issue signal VOUT2. Signal VOUT1 issued from NOR circuit 1 remains at L-level.

Then, description will be given on the case where the self-refresh mode is designated. In this case, self-refresh trigger signal SEL at L-level is issued correspondingly to the self-refresh mode (time t1–).

N-channel MOS transistor NST3 is turned off, and the potential on node Z1 rises to a level which keeps a balance between the quantities of current flowing through P-channel MOS transistor PST1 and N-channel MOS transistor NST1. Thereby, differential amplifier 2 is disabled.

P-channel MOS transistor PLT1 is turned on, and the potential on node Y1 rises to power supply potential VDD. Thereby, NOR circuit 1 is enabled. NOR circuit 1 issues signal VOUT1 in response to clock enable signal CKE.

More specifically, in the self-refresh mode, external clock enable signal ext.CLK is 0.2 V or lower, and therefore is at the voltage level lower than the threshold voltage of the transistor forming NOR circuit 1. Therefore, a through current does not flow through the CMOS inverter forming NOR circuit 1. Also, differential amplifier 2 is disabled so that a current does not occur. Therefore, the power consumption is reduced as compared with the case wherein differential amplifier 2 is solely used as the interface circuit.

According to the semiconductor memory device of the embodiment 1 of the invention, as described above, the interface circuit can be selected for the mode (e.g., self-refresh mode) requiring suppression of the current consumption so that the current consumption can be reduced.

[Embodiment 2]

A semiconductor memory device of an embodiment 2 will be described below. A whole structure of the semiconductor memory device of the embodiment 2 is the same as that of semiconductor memory device shown 1000 in FIG. 1.

Semiconductor memory device 1000 of the embodiment 2 includes an interface circuit 200, which will be described below, in place of interface circuit 100 shown in FIG. 1. An example of a specific structure of interface circuit 200 of the embodiment 2 will be described below with reference to a circuit diagram of FIG. 5.

Figure 5:
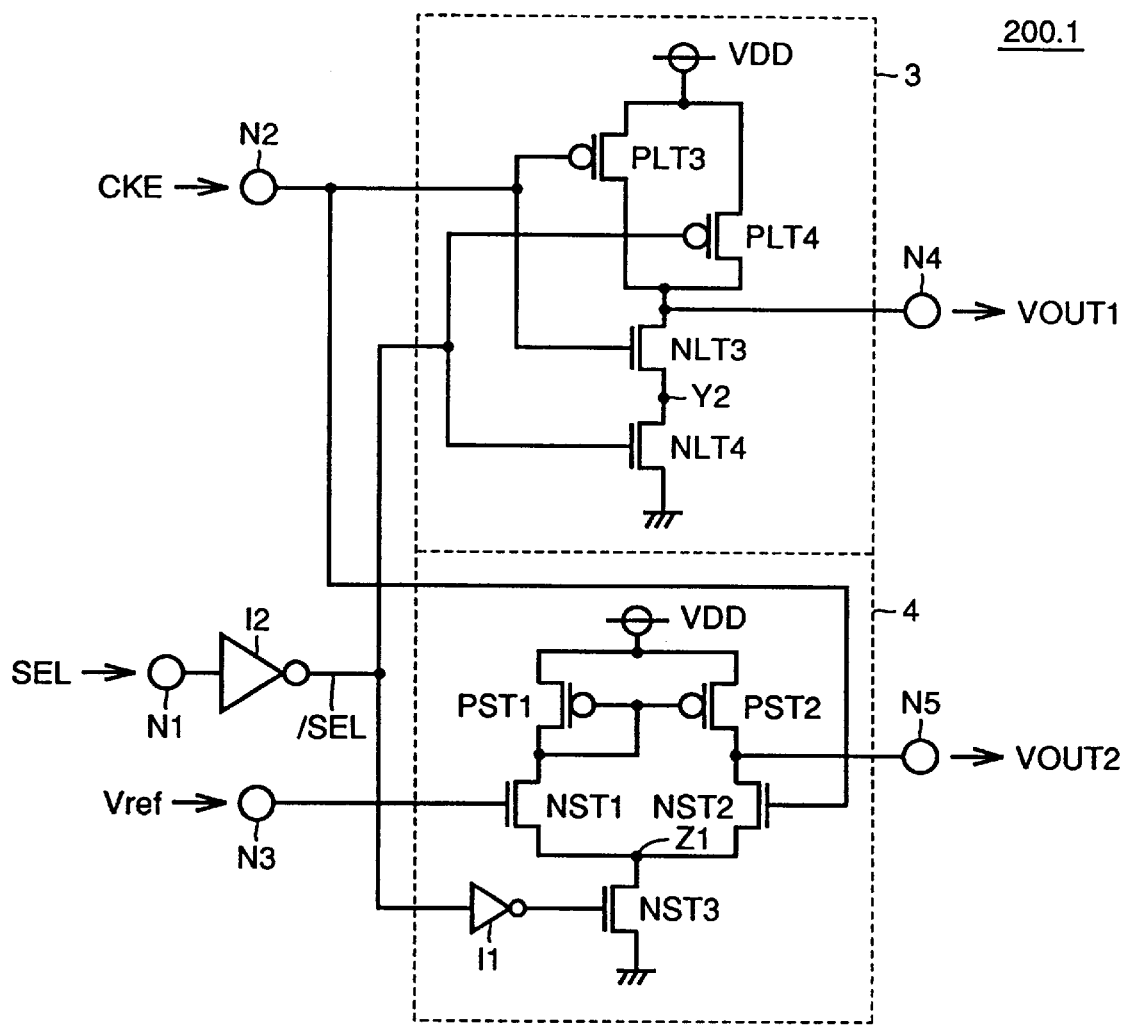
FIG. 5 is a circuit diagram showing an example of a specific structure of an interface circuit 200 according to an embodiment 2.

The same components as those in interface circuit 100 of the embodiment 1 bear the same reference characters, and will not be described below. The interface circuit 200, which is shown in FIG. 5 and will be referred to as interface circuit 200.1 hereinafter, includes an inverter circuit I2, NAND circuit 3 and differential amplifier 4.

Inverter circuit I2 inverts self-refresh trigger signal SEL received on node N1 for outputting the inverted signal, which will be referred to as an inverted self-refresh trigger signal /SEL.

Differential amplifier 4 includes P-channel MOS transistors PST1 and PST2 as well as N-channel MOS transistors NST1, NST2 and NST3. Structures of them are the same as those already described.

Differential amplifier 4 further includes an inverter circuit I1. Inverter circuit I1 inverts inverted self-refresh trigger signal /SEL and outputs the result. N-channel MOS transistor NST3 receives on its gate electrode a signal synchronized with self-refresh trigger signal SEL through inverter circuit I1. Signal VOUT2 is issued in response to clock enable signal CKE from node N5 connected to a connection node between P-channel MOS transistor PST2 and N-channel MOS transistor NST2. Differential amplifier 4 is an SSTL interface.

NAND circuit 3 includes P-channel MOS transistors PLT3 and PLT4 as well as N-channel MOS transistor NLT3 and NLT4. P-channel MOS transistors PLT3 and PLT4 are connected in parallel between power supply potential VDD and one of conductive terminals of N-channel MOS transistor NLT3. One of conductive terminals of N-channel MOS transistor NLT4 is connected to the ground potential, and the other conductive terminal is connected to the other conductive terminal of N-channel MOS transistor NLT3 through a node Y2.

Each of P-channel MOS transistor PLT3 and N-channel MOS transistor NLT3 receives clock enable signal CKE on its gate electrode. Each of P-channel MOS transistor PLT4 and N-channel MOS transistor NLT4 receives inverted self-refresh trigger signal /SEL from inverter circuit I2. Signal VOUT1 is issued in response to clock enable signal CKE from node N4 connected to a connection node between P-channel MOS transistor PLT3 and N-channel MOS transistor NLT3. NAND circuit 3 is a kind of LVTTL interface, and issues signal VOUT1 in response to the input signal at LVTTL level.

An operation of interface circuit 200.1 shown in FIG. 5 will be described below with reference to timing charts of FIGS. 6A to 6H.

First, an operation in a mode other than the self-refresh mode will be described below (time t0–t1). In this case, self-refresh trigger signal SEL is at H-level and therefore inactive (inverted self-refresh trigger signal /SEAL is at L-level). N-channel MOS transistor NST3 is on, and the potential on node Z1 (i.e., connection node between N-channel MOS transistors NLT1 and NLT2) is at L-level. Thereby, differential amplifier 4 is enabled.

Meanwhile, N-channel MOS transistor NLT4 is off, and P-channel MOS transistor PLT4 is on so that the potential on node Y2 (i.e., connection node between N-channel MOS transistors NLT3 and NLT4) is floated slightly above L-level. Thereby, NAND circuit 3 is disabled.

When clock enable signal CKE at H-level (reference voltage Vref+amplitude width VH) is input in this state, differential amplifier 4 amplifies the potential difference between clock enable signal CKE and reference voltage Vref to issue signal VOUT2. Signal VOUT1 issued from NAND circuit 3 still remains at L-level.

Description will now be given on the case where the self-refresh mode is designated. In this case, self-refresh trigger signal SEL at L-level is generated correspondingly to the self-refresh mode (time t1–)

N-channel MOS transistor NST3 is turned off, and the potential on node Z1 rises to a level which keeps a balance between quantities of currents at P-channel MOS transistor PST1 and N-channel MOS transistor NST1. Thereby, differential amplifier 4 is disabled.

Meanwhile, N-channel MOS transistor NLT4 is turned on, and P-channel MOS transistor PLT4 is turned off so that the potential on node Y2 lowers to L-level. Thereby, NAND circuit 3 is enabled. In response to the internal signal, i.e., clock enable signal CKE, NAND circuit 3 issues signal VOUT1.

More specifically, in the self-refresh mode, external clock enable signal ext.CKE is at the voltage level of 0.2 V or lower, which is lower than the threshold voltage of the transistor forming NAND circuit 3. Therefore, a through current does not flow at the CMOS inverter forming NAND circuit 3. Since differential amplifier 4 is disabled, a current does not occur. Therefore, the power consumption is reduced as compared with the case where differential amplifier 4 is solely used as the interface circuit.

Description will now be given on another example of a specific structure of interface circuit 200 according to the embodiment 2 of the invention with reference to FIG. 7.

The same components as those in interface circuit 100 shown in FIG. 3 bear the same reference numbers, and will not be described below.

Figure 7:
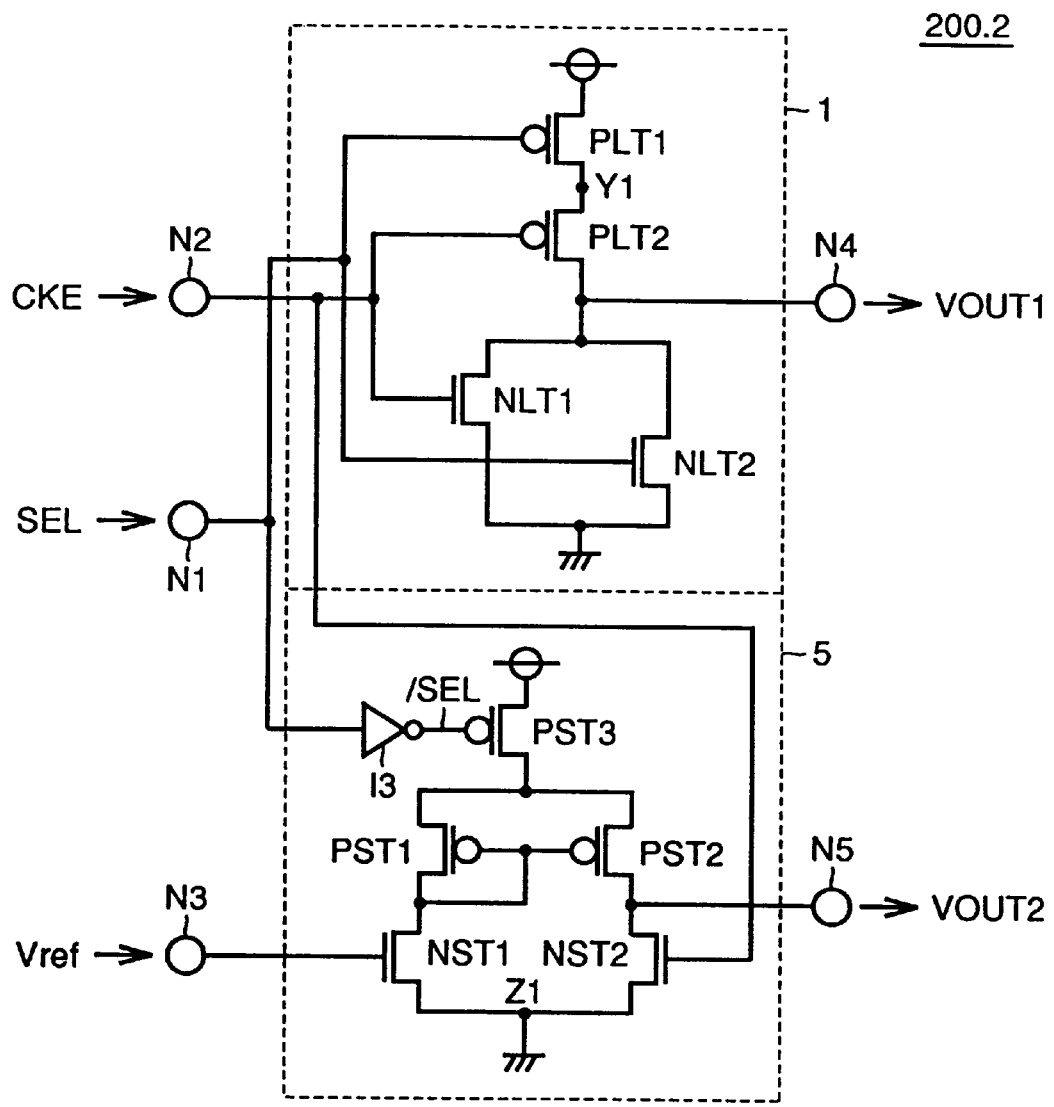
FIG. 7 is a circuit diagram showing another specific structure of the interface circuit 200 according to the embodiment 2 of the invention.
Figure 8:
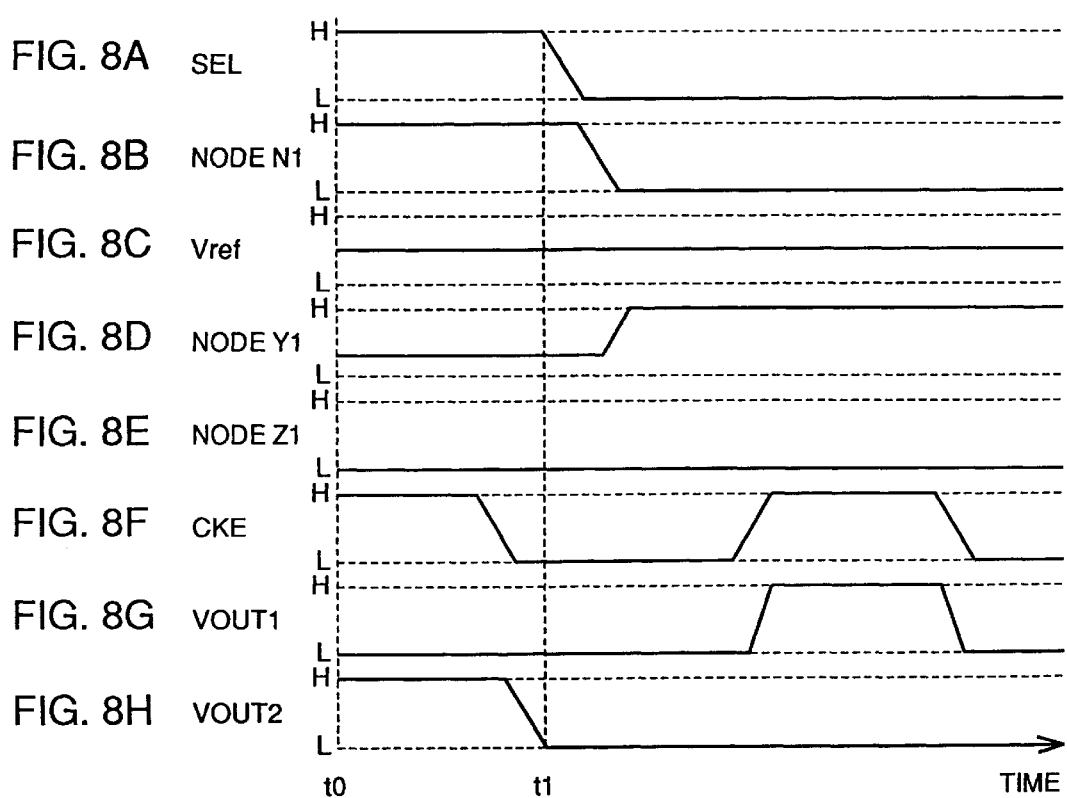
FIGS. 8A to 8H are timing charts showing an operation of an interface circuit 200.2 shown in FIG. 7.

Interface circuit 200, which is shown in FIG. 7 and will be referred to as an interface circuit 200.2, includes NOR circuit 1 and a differential circuit 5. As already described, NOR circuit 1 is an LVTTL interface, and issues signal VOUT1 corresponding to clock enable signal CKE in response to self-refresh trigger signal SEL.

Differential amplifier 5 includes P-channel MOS transistors PST1 and PST2 as well as N-channel MOS transistors NST1 and NST2. P-channel MOS transistors PST1 and PST2 as well as N-channel MOS transistors NST1 and NST2 are connected in the same manner as those in differential amplifier 2 shown in FIG. 3.

Differential amplifier 5 further includes an inverter circuit I3 and a P-channel MOS transistor PST3. Inverter circuit I3 inverts self-refresh trigger signal SEL and outputs the result. The other conductive terminal of each of N-channel MOS transistors NST1 and NST2 is connected to the ground potential.

P-channel MOS transistor PST3 is connected between power supply potential VDD and one of conductive terminals of each of P-channel MOS transistors PST1 and PST2. P-channel MOS transistor PST3 is a control transistor receiving on its gate electrode a signal, which is produced by inverting self-refresh trigger signal SEL and is also referred to as inverted self-refresh trigger signal /SEL, through inverter circuit I3. Differential amplifier 5 is enabled/disabled in response to turn-on/off of P-channel MOS transistor PST3. Differential amplifier 5 is an SSTL interface.

An operation of interface circuit 200.2 shown in FIG. 7 will be described below with reference to timing charts of FIGS. 8A to 8H.

First, description will be given on the operation in a mode other than the self-refresh mode (time t0–t1). In this case, self-refresh trigger signal SEL is at H-level and therefore inactive (inverted self-refresh trigger signal /SEL is at L-level). P-channel MOS transistor PST3 is on, and node Z1 (i.e., connection node between N-channel MOS transistors NST1 and NST2) is at L-level. Thereby, differential amplifier 5 is enabled.

Meanwhile, N-channel MOS transistor NLT2 is on, and P-channel MOS transistor PLT1 is off. The potential on node Y1 (connection node between P-channel MOS transistors PLT1 and PLT2) is floated slightly above L-level. Thereby, NOR circuit 1 is disabled.

When clock enable signal CKE at H-level (reference voltage Vref+amplitude width VH) is input in this state, differential amplifier 5 amplifies the potential difference between clock enable signal CKE and reference voltage Vref, and issues signal VOUT2. Signal VOUT1 issued from NOR circuit 1 remains at L-level.

Then, description will be given on the case where the self-refresh mode is designated. In this case, self-refresh trigger signal SEL at L-level is issued correspondingly to the self-refresh mode (time t1–).

P-channel MOS transistor PST3 is turned off, and differential amplifier 5 is disabled.

P-channel MOS transistor PLT1 is turned on, and the potential on node Y1 rises to power supply potential VDD. Thereby, NOR circuit 1 is enabled. NOR circuit 1 issues signal VOUT1 in response to clock enable signal CKE.

More specifically, in the self-refresh mode, external clock enable signal ext.CKE is at the voltage level of 0.2 V or lower, which is lower than the threshold voltage of the transistor forming NOR circuit 1. Therefore, a through current does not flow at the CMOS inverter forming NOR circuit 1. Since differential amplifier 5 is disabled, a current does not occur. Therefore, the power consumption is reduced as compared with the case where differential amplifier 5 is solely used as the interface circuit.

Figure 9:
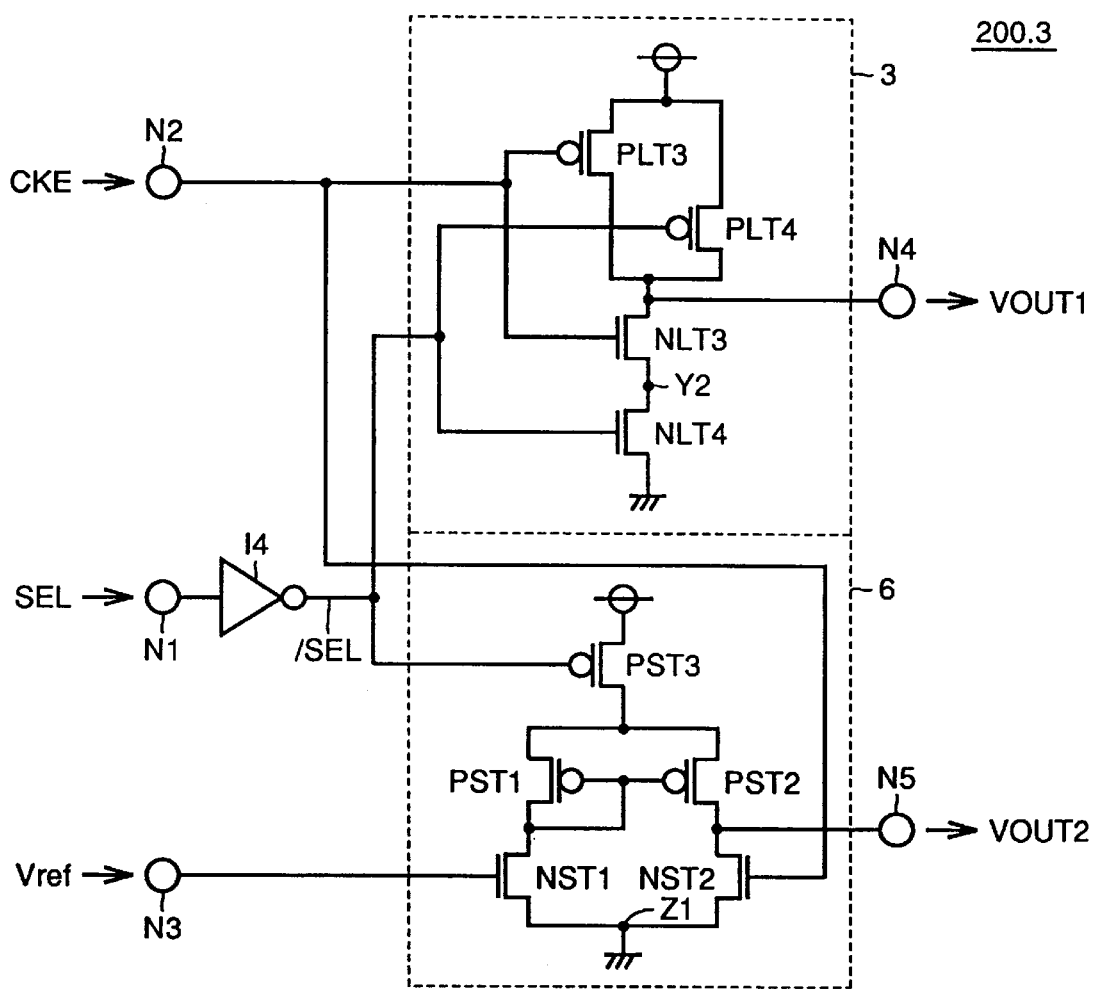
FIG. 9 is a circuit diagram showing an example of a specific structure of the interface circuit 200 according to the embodiment 2 of the invention.
Figure 11:
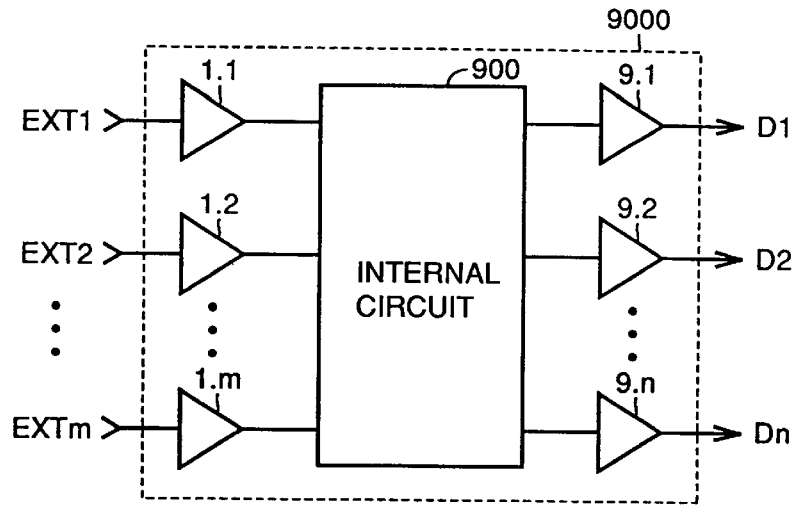
FIG. 11 is a block diagram showing a structure of a major portion of a semiconductor memory device 9000 in the prior art.

Description will now be given on still another example of a specific structure of interface circuit 200 according to the embodiment 2 of the invention with reference to FIG. 9.

The same components as those in interface circuits 100 and 200 shown in FIGS. 3, 5 and 7 bear the same reference numbers, and will not be described below. Interface circuit 200, which is shown in FIG. 9 and will be referred to as an interface circuit 200.3, includes an inverter circuit I4, NAND circuit 3 and a differential amplifier 6.

Inverter circuit I4 inverts self-refresh trigger signal SEL, which is received on node N1 for outputting the inverted signal, which is also referred to as inverted self-refresh trigger signal /SEL.

Differential amplifier 6 includes P-channel MOS transistors PST1, PST2 and PST3 as well as N-channel MOS transistors NST1, NST2 and NST3. These structures are the same as those shown in FIG. 7.

P-channel MOS transistor PST3 is a control transistor, and receives on its gate electrode inverted self-refresh trigger signal /SEL through inverter circuit I4. Differential amplifier 6 is enabled/disabled in response to turn-on/off of P-channel MOS transistor PST3. Differential amplifier 6 is an SSTL interface.

Each of the control transistors of NAND circuit 3, i.e., P-channel MOS transistor PLT4 and N-channel MOS transistor NLT4 receives inverted self-refresh trigger signal /SEL through inverter circuit I4. As already described, NAND circuit 3 is a kind of LVTTL interface, and issues signal VOUT1 corresponding to clock enable signal CKE in response to self-refresh trigger signal SEL.

An operation of interface circuit 200.3 shown in FIG. 9 will be described below with reference to FIGS. 10A to 10H.

First, description will be given on the operation in a mode other than the self-refresh mode (time t0–t1). In this case, self-refresh trigger signal SEL is at H-level and therefore inactive (inverted self-refresh trigger signal /SEL is at L-level). P-channel MOS transistor PST3 is on, and node Z1 (i.e., connection node between N-channel MOS transistors NST1 and NST2) is at L-level. Thereby, differential amplifier 6 is enabled.

Meanwhile, N-channel MOS transistor NLT4 is off, and P-channel MOS transistor PLT4 is on. The potential on node Y2 (connection node between N-channel MOS transistors NLT3 and NLT4) is floated slightly above L-level. Thereby, NAND circuit 3 is disabled.

When clock enable signal CKE at H-level (reference voltage Vref+amplitude width VH) is input in this state, differential amplifier 6 amplifies the potential difference between clock enable signal CKE and reference voltage Vref, and issues signal VOUT2. Signal VOUT1 issued from NAND circuit 3 remains at L-level.

Then, description will be given on the case where the self-refresh mode is designated. In this case, self-refresh trigger signal SEL at L-level is issued correspondingly to the self-refresh mode (time t1–).

P-channel MOS transistor PST3 is turned off, and differential amplifier 6 is disabled.

N-channel MOS transistor NLT4 is turned on, and the potential on node Y2 falls to L-level. Thereby, NAND circuit 3 is enabled. NAND circuit 3 issues signal VOUT1 in response to clock enable signal CKE.

More specifically, in the self-refresh mode, external clock enable signal ext.CKE is at the voltage level of 0.2 V or lower, which is lower than the threshold voltage of the transistor forming NAND circuit 3. Therefore, a through current does not flow at the CMOS inverter forming NAND circuit 3. Since differential amplifier 6 is disabled, a current does not occur. Therefore, the power consumption is reduced as compared with the case where differential amplifier 6 is solely used as the interface circuit.

According to the semiconductor memory device of the embodiment 2 of the invention, as described above, the interface circuit is selected for the mode (e.g., self-refresh mode) requiring suppression of the current consumption so that the current consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

mode detecting means for detecting designation of a specific mode in response to an externally applied mode designating signal, and issuing a corresponding mode trigger signal as a result of the detection;

an input terminal for receiving an externally transmitted input signal, said externally applied input signal being a signal at a first potential level in said specific mode and being a signal having a second potential level with a small amplitude logical signal superposed thereon in a mode other than said specific mode;

an internal circuit for operating in response to said input signal;

first interface means being activated in said specific mode to determine a logical level of said input signal based on comparison between the potential level of said input signal supplied through said input terminal and a threshold level, and issue an internal signal corresponding to a result of the determination to said internal circuit; and second interface means being activated, in a mode other than said specific mode, to determine the logical level of said input signal based on comparison between the potential level of said input signal supplied through said input terminal and the second potential level, and issue an internal signal corresponding to a result of the determination to said internal circuit.

2. The semiconductor memory device according to claim 1, further comprising:

a memory cell array including a plurality of memory cells arranged in rows and columns; and address generating means for generating an internal address signal designating said memory cell in said memory cell array in accordance with the result of the detection by said mode detecting means, wherein said specific mode is a self-refresh mode for refreshing data of said memory cell in response to said internal address signal generated by said address generating means.

3. The semiconductor memory device according to claim 2, wherein said first interface means is formed of an NOR circuit.

4. The semiconductor memory device according to claim 2, wherein said first interface means is formed of an NAND circuit.

5. The semiconductor memory device according to claim 2, wherein said second interface means is formed of a differential amplifier for amplifying a potential difference between said second potential level and said input signal.

6. The semiconductor memory device according to claim 3, wherein said mode trigger signal is at an L-level an active in said self-refresh mode;

said first interface means includes:
a first P-channel MOS transistor having one conductive terminal connected to a power supply potential,
a second P-channel MOS transistor having one conductive terminal connected to the other conductive terminal of said first P-channel MOS transistor, and first and second N-channel MOS transistors connected in parallel between the other conductive terminal of said second P-channel MOS transistor and a ground potential;
    each of gate electrodes of said first P-channel MOS transistor and said second N-channel MOS transistor receives said mode trigger signal;
    each of gate electrodes of said second P-channel MOS transistor and said first N-channel MOS transistor receives said input signal; and
    said internal signal is issued from a connection node between said second P-channel MOS transistor and said first N-channel MOS transistor.

7. The semiconductor memory device according to claim 4, wherein
said mode trigger signal is at an L-level active in said self-refresh mode;
said first interface means includes:
    first and second P-channel MOS transistors having one conductive terminal connected to a power supply potential, and the other conductive terminals connected to each other
    first and second N-channel MOS transistors connected in series between the other conductive terminals said first and second P-channel MOS transistors and a ground potential;
    each of gate electrodes of said second P-channel MOS transistor and said second N-channel MOS transistor receives a signal formed by inverting said mode trigger signal;
    each of gate electrodes of said first P-channel MOS transistor and said first N-channel MOS transistor receives said input signal; and
    said internal signal is issued from a connection node between said first P-channel MOS transistor and said first N-channel MOS transistor.

8. The semiconductor memory device according to claim 5, wherein
said mode trigger signal is at an L-level active state in said self-refresh mode;
said second interface means includes:
    first and second P-channel MOS transistors each having one conductive terminal connected to a power supply potential,
    a first N-channel MOS transistor having one conductive terminal connected to the other conductive terminal of said first P-channel MOS transistor,
    a second N-channel MOS transistor having one conductive terminal connected to the other conductive terminal of said second P-channel MOS transistor, and
    a third N-channel MOS transistor connected between the other conductive terminal of each of said first and second N-channel MOS transistors and a ground potential;
    each of gate electrodes of said first P-channel MOS transistor and said second P-channel MOS transistor is connected to a connection node between said first P-channel MOS transistor and said first N-channel MOS transistor;
    a gate electrode of said third N-channel MOS transistor receives said mode trigger signal;
    a gate electrode of said first N-channel MOS transistor receives a reference potential at said second potential level;
    a gate electrode of said second N-channel MOS transistor receives said input signal; and
    said internal signal is issued from a connection node between said second P-channel MOS transistor and said second N-channel MOS transistor.

9. The semiconductor memory device according to claim 5, wherein
said mode trigger signal is at an L-level active in said self-refresh mode;
said second interface means includes:
    first and second P-channel MOS transistors having one conductive terminal connected to each other,
    a first N-channel MOS transistor connected between the other conductive terminal of said first P-channel MOS transistor and a ground potential,
    a second N-channel MOS transistor connected between the other conductive terminal of said second P-channel MOS transistor and the ground potential, and
    a third P-channel MOS transistor connected between the other conductive terminal of each of said first and second P-channel MOS transistors and a power supply potential;
    each of gate electrodes of said first P-channel MOS transistor and said second P-channel MOS transistor is connected to a connection node between said first P-channel MOS transistor and said first N-channel MOS transistor,
    a gate electrode of said third P-channel MOS transistor receives a signal formed by inverting said mode trigger signal;
    a gate electrode of said first N-channel MOS transistor receives a reference potential at said second potential level;
    a gate electrode of said second N-channel MOS transistor receives said input signal; and
    said internal signal is issued from a connection node between said second P-channel MOS transistor and said second N-channel MOS transistor.

10. The semiconductor memory device according to claim 2, wherein
said mode trigger signal is at an L-level active in said self-refresh mode;
said first interface means includes:
    a first P-channel MOS transistor having one conductive terminal connected to a power supply potential,
    a second P-channel MOS transistor having one conductive terminal connected to the other conductive terminal of said first P-channel MOS transistor, and
    first and second N-channel MOS transistors connected in parallel between the other conductive terminal of said second P-channel MOS transistor and a ground potential;
    each of gate electrodes of said first P-channel MOS transistor and said second N-channel MOS transistor receives said mode trigger signal;
    each of gate electrodes of said second P-channel MOS transistor and said first N-channel MOS transistor receives said input signal;
    said internal signal is issued from a connection node between said second P-channel MOS transistor and said first N-channel MOS transistor;
said second interface means includes:
    third and fourth P-channel MOS transistors each having one conductive terminal connected to the power supply potential,
    a third N-channel MOS transistor having one conductive terminal connected to the other conductive terminal of said third P-channel MOS transistor, a fourth N-channel MOS transistor connected at one of its conductive terminals to the other conductive terminal of said fourth P-channel MOS transistor, and a fifth N-channel MOS transistor connected between the other conductive terminal of each of said third and fourth N-channel MOS transistors and the ground potential;

each of gate electrodes of said third and fourth P-channel MOS transistors is connected to a connection node between said third P-channel MOS transistor and said third N-channel MOS transistor;

a gate electrode of said fifth N-channel MOS transistor receives said mode trigger signal;

a gate electrode of said third N-channel MOS transistor receives a reference potential at said second potential level;

a gate electrode of said fourth N-channel MOS transistor receives said input signal; and said internal signal is issued from a connection node between said fourth P-channel MOS transistor and said fourth N-channel MOS transistor.

11. The semiconductor memory device according to claim 2, wherein said mode trigger signal is at an L-level active in said self-refresh mode;

said first interface means includes:

first and second P-channel MOS transistors having one conductive terminal connected to a power supply potential, and the other conductive terminals connected to each other first and second N-channel MOS transistors connected in series between the other conductive terminals said first and second P-channel MOS transistors and a ground potential;

each of gate electrodes of said second P-channel MOS transistor and said second N-channel MOS transistor receives a signal formed by inverting said mode trigger signal;

each of gate electrodes of said first P-channel MOS transistor and said first N-channel MOS transistor receives said input signal;

said internal signal is issued from a connection node between said first P-channel MOS transistor and said first N-channel MOS transistor;

said second interface means includes:

third and fourth P-channel MOS transistors each having one conductive terminal connected to a power supply potential, a third N-channel MOS transistor having one conductive terminal connected to the other conductive terminal of said third P-channel MOS transistor, a fourth N-channel MOS transistor having one conductive terminal connected to the other conductive terminal of said fourth P-channel MOS transistor, and a fifth N-channel MOS transistor connected between the other conductive terminal of each of said third and fourth N-channel MOS transistors and the ground potential;

each of gate electrodes of said third and fourth P-channel MOS transistors is connected to a connection node between said third P-channel MOS transistor and said third N-channel MOS transistor;

a gate electrode of said fifth N-channel MOS transistor receives said mode trigger signal;

a gate electrode of said third N-channel MOS transistor receives a reference potential at said second potential level;

a gate electrode of said fourth N-channel MOS transistor receives said input signal; and said internal signal is issued from a connection node between said fourth P-channel MOS transistor and said fourth N-channel MOS transistor.

12. The semiconductor memory device according to claim 2, wherein said mode trigger signal is at an L-level active state in said self-refresh mode;

said first interface means includes:

a first P-channel MOS transistor having one conductive terminal connected to a power supply potential, a second P-channel MOS transistor having one conductive terminal connected to the other conductive terminal of said first P-channel MOS transistor, and first and second N-channel MOS transistors connected in parallel between the other conductive terminal of said second P-channel MOS transistor and a ground potential;

each of gate electrodes of said first P-channel MOS transistor and said second N-channel MOS transistor receives said mode trigger signal;

each of gate electrodes of said second P-channel MOS transistor and said first N-channel MOS transistor receives said input signal;

said internal signal is issued from a connection node between said second P-channel MOS transistor and said first N-channel MOS transistor;

said second interface means includes:

third and fourth P-channel MOS transistors having one conductive terminal connected to each other, a third N-channel MOS transistor connected between the other conductive terminal of said third P-channel MOS transistor and the ground potential, a fourth N-channel MOS transistor connected between the other conductive terminal of said fourth P-channel MOS transistor and the ground potential, and a fifth P-channel MOS transistor connected between the other conductive terminal of each of said third and fourth P-channel MOS transistors and the power supply potential;

each of gate electrodes of said third and fourth P-channel MOS transistors is connected to a connection node between said third P-channel MOS transistor and said third N-channel MOS transistor;

a gate electrode of said fifth P-channel MOS transistor receives a signal formed by inverting said mode trigger signal;

a gate electrode of said third N-channel MOS transistor receives a reference potential at said second potential level;

a gate electrode of said fourth N-channel MOS transistor receives said input signal; and said internal signal is issued from a connection node between said fourth P-channel MOS transistor and said fourth N-channel MOS transistor.

13. The semiconductor memory device according to claim 2, wherein said mode trigger signal is at an L-level active in said self-refresh mode;

said first interface means includes:

first and second P-channel MOS transistors having one conductive terminal connected to a power supply potential, and the other conductive terminals connected to each other first and second N-channel MOS transistors connected in series between the other conductive terminals said first and second P-channel MOS transistors and a ground potential;
   each of gate electrodes of said second P-channel MOS transistor and said second N-channel MOS transistor receives a signal formed by inverting said mode trigger signal;
   each of gate electrodes of said first P-channel MOS transistor and said first N-channel MOS transistor receives said input signal;
   said internal signal is issued from a connection node between said first P-channel MOS transistor and said first N-channel MOS transistor;
said second interface means includes:
   third and fourth P-channel MOS transistors having one conductive terminal connected to each other,
a third N-channel MOS transistor connected between the other conductive terminal of said third P-channel MOS transistor and the ground potential,
a fourth N-channel MOS transistor connected between the other conductive terminal of said fourth P-channel MOS transistor and the ground potential, and
a fifth P-channel MOS transistor connected between the other conductive terminal of each of said third and fourth P-channel MOS transistors and the power supply potential;
   each of gate electrodes of said third and fourth P-channel MOS transistors is connected to a connection node between said third P-channel MOS transistor and said third N-channel MOS transistor;
   a gate electrode of said fifth P-channel MOS transistor receives a signal formed by inverting said mode trigger signal;
   a gate electrode of said third N-channel MOS transistor receives a reference potential at said second potential level;
   a gate electrode of said fourth N-channel MOS transistor receives said input signal; and
   said internal signal is issued from a connection node between said fourth P-channel MOS transistor and said fourth N-channel MOS transistor.

14. The semiconductor memory device according to claim 1, wherein
said mode trigger signal is at an L-level active state in said specific mode;
said first interface means includes:
   a first P-channel MOS transistor having one conductive terminal connected to a power supply potential,
a second P-channel MOS transistor having one conductive terminal connected to the other conductive terminal of said first P-channel MOS transistor, and
first and second N-channel MOS transistors connected in parallel between the other conductive terminal of said second P-channel MOS transistor and a ground potential;
   each of gate electrodes of said first P-channel MOS transistor and said second N-channel MOS transistor receives said mode trigger signal;
   each of gate electrodes of said second P-channel MOS transistor and said first N-channel MOS transistor receives said input signal;
   said internal signal is issued from a connection node between said second P-channel MOS transistor and said first N-channel MOS transistor;
said second interface means includes:
   third and fourth P-channel MOS transistors each having one conductive terminal connected to the power supply potential,
a third N-channel MOS transistor having one conductive terminal connected to the other conductive terminal of said third P-channel MOS transistor,
a fourth N-channel MOS transistor connected at one of its conductive terminals to the other conductive terminal of said fourth P-channel MOS transistor, and
a fifth N-channel MOS transistor connected between the other conductive terminal of each of said third and fourth N-channel MOS transistors and the ground potential;
   each of gate electrodes of said third and fourth P-channel MOS transistors is connected to a connection node between said third P-channel MOS transistor and said third N-channel MOS transistor;
   a gate electrode of said fifth N-channel MOS transistor receives said mode trigger signal;
   a gate electrode of said third N-channel MOS transistor receives a reference potential at said second potential level;
   a gate electrode of said fourth N-channel MOS transistor receives said input signal; and
   said internal signal is issued from a connection node between said fourth P-channel MOS transistor and said fourth N-channel MOS transistor.

15. The semiconductor memory device according to claim 1, wherein
said mode trigger signal is at an L-level active in said specific mode;
said first interface means includes:
first and second P-channel MOS transistors having one conductive terminal connected to a power supply potential, and the other conductive terminals connected to each other
first and second N-channel MOS transistors connected in series between the other conductive terminals said first and second P-channel MOS transistors and a ground potential;
each of gate electrodes of said second P-channel MOS transistor and said second N-channel MOS transistor receives a signal formed by inverting said mode trigger signal;
each of gate electrodes of said first P-channel MOS transistor and said first N-channel MOS transistor receives said input signal;
said internal signal is issued from a connection node between said first P-channel MOS transistor and said first N-channel MOS transistor;
said second interface means includes:
third and fourth P-channel MOS transistors each having one conductive terminal connected to the power supply potential,
a third N-channel MOS transistor having one conductive terminal connected to the other conductive terminal of said third P-channel MOS transistor,
a fourth N-channel MOS transistor having one conductive terminal connected to the other conductive terminal of said fourth P-channel MOS transistor, and
a fifth N-channel MOS transistor connected between the other conductive terminal of each of said third and fourth N-channel MOS transistors and the ground potential;

each of gate electrodes of said third and fourth P-channel MOS transistors is connected to a connection node between said third P-channel MOS transistor and said third N-channel MOS transistor;

a gate electrode of said fifth N-channel MOS transistor receives said mode trigger signal;

a gate electrode of said third N-channel MOS transistor receives a reference potential at said second potential level;

a gate electrode of said fourth N-channel MOS transistor receives said input signal; and said internal signal is issued from a connection node between said fourth P-channel MOS transistor and said fourth N-channel MOS transistor.

16. The semiconductor memory device according to claim 1, wherein said mode trigger signal is at an L-level active in said specific mode said first interface means includes:

a first P-channel MOS transistor having one conductive terminal connected to the other conductive terminal of said first P-channel MOS transistor, and first and second N-channel MOS transistors connected in parallel between the other conductive terminal of said second P-channel MOS transistor and a ground potential;

each of gate electrodes of said first P-channel MOS transistor and said second N-channel MOS transistor receives said mode trigger signal;

each of gate electrodes of said second P-channel MOS transistor and said first N-channel MOS transistor receives said input signal;

said internal signal is issued from a connection node between said second P-channel MOS transistor and said first N-channel MOS transistor;

said second interface means includes:

third and fourth P-channel MOS transistors having one conductive terminal connected to each other, a third N-channel MOS transistor connected between the other conductive terminal of said ;third P-channel MOS transistor and the ground potential, a fourth N-channel MOS transistor connected between the other conductive terminal of said fourth P-channel MOS transistor and the ground potential, and a fifth P-channel MOS transistor connected between the other conductive terminal of each of said third and fourth P-channel MOS transistors and the power supply potential;

each of gate electrodes of said third and fourth P-channel MOS transistors is connected to a connection node between said third P-channel MOS transistor and said third N-channel MOS transistor;

a gate electrode of said fifth P-channel MOS transistor receives a signal formed by inverting said mode trigger signal;

a gate electrode of said third N-channel MOS transistor receives a reference potential at said second potential level;

a gate electrode of said fourth N-channel MOS transistor receives said input signal; and said internal signal is issued from a connection node between said fourth P-channel MOS transistor and said fourth N-channel MOS transistor.

17. The semiconductor memory device according to claim 1, wherein said mode trigger signal is at an L-level active state in said specific mode;

said first interface means includes:

first and second P-channel MOS transistors having one conductive terminal connected to a power supply potential, and the other conductive terminals connected to each other first and second N-channel MOS transistors connected in series between the other conductive terminal of each of said first and second P-channel MOS transistors and a ground potential;

each of gate electrodes of said second P-channel MOS transistor and said second N-channel MOS transistor receives a signal formed by inverting said mode trigger signal;

each of gate electrodes of said first P-channel MOS transistor and said first N-channel MOS transistor receives said input signal;

said internal signal is issued from a connection node between said first P-channel MOS transistor and said first N-channel MOS transistor;

said second interface means includes:

third and fourth P-channel MOS transistors having one conductive terminal connected to each other, a third N-channel MOS transistor connected between the other conductive terminal of said third P-channel MOS transistor and the ground potential, a fourth N-channel MOS transistor connected between the other conductive terminal of said fourth P-channel MOS transistor and the ground potential, and a fifth P-channel MOS transistor connected between the other conductive terminal of each of said third and fourth P-channel MOS transistors and the power supply potential;

each of gate electrodes of said third and fourth P-channel MOS transistors is connected to a connection node between said third P-channel MOS transistor and said third N-channel MOS transistor;

a gate electrode of said fifth P-channel MOS transistor receives said mode trigger signal;

a gate electrode of said third N-channel MOS transistor receives a reference potential at said second potential level;

a gate electrode of said fourth N-channel MOS transistor receives said input signal; and said internal signal is issued from a connection node between said fourth P-channel MOS transistor and said fourth N-channel MOS transistor.

* * * * *